United States Patent
Hayashi

(10) Patent No.: US 6,469,935 B2
(45) Date of Patent: Oct. 22, 2002

(54) ARRAY ARCHITECTURE NONVOLATILE MEMORY AND ITS OPERATION METHODS

(75) Inventor: Yutaka Hayashi, Ibaraki (JP)

(73) Assignee: Halo LSI Design & Device Technology, Inc., Wappingers Falls, NY (US)

( * ) Notice: Subject to any disclaimer, the term of this patent is extended or adjusted under 35 U.S.C. 154(b) by 0 days.

(21) Appl. No.: 09/810,122

(22) Filed: Mar. 19, 2001

(65) Prior Publication Data

US 2002/0008993 A1 Jan. 24, 2002

(51) Int. Cl.[7] .............................................. G11C 16/04
(52) U.S. Cl. ............................ 365/185.18; 365/185.05; 365/185.12
(58) Field of Search ..................... 365/185.18, 185.05, 365/185.12; 257/316–320

(56) References Cited

U.S. PATENT DOCUMENTS 5,487,034 A * 1/1996 Inoue .................... 365/185.18
5,668,757 A * 9/1997 Jeng ...................... 365/185.14
6,399,441 B1 * 6/2002 Ogura et al. ................ 365/218

* cited by examiner

Primary Examiner—Huan Hoang
(74) Attorney, Agent, or Firm—George O. Saile; Stephen B. Ackerman

(57) ABSTRACT

In the present invention a nonvolatile memory array architecture can be realized by a fabrication process more compatible to an MOS logic fabrication process as compared with previous nonvolatile memory array architectures. Higher write and/or read speed is possible because of a lower bit line resistance. A high hard bit density near $4F^2$ is possible when a self-align contact technology and a border less contact technology are used. Connection regions are formed throughout the memory array comprising four cells that are connected to one bit line. The connection regions can be formed in the same processing step with opposite conductivity regions for economy of processing. A plurality of memory cells are two dimensionally disposed in two different directions with connection regions, conductive bit lines extending in the first direction, conductive word lines extending in the second direction, and conductive control lines.

17 Claims, 11 Drawing Sheets

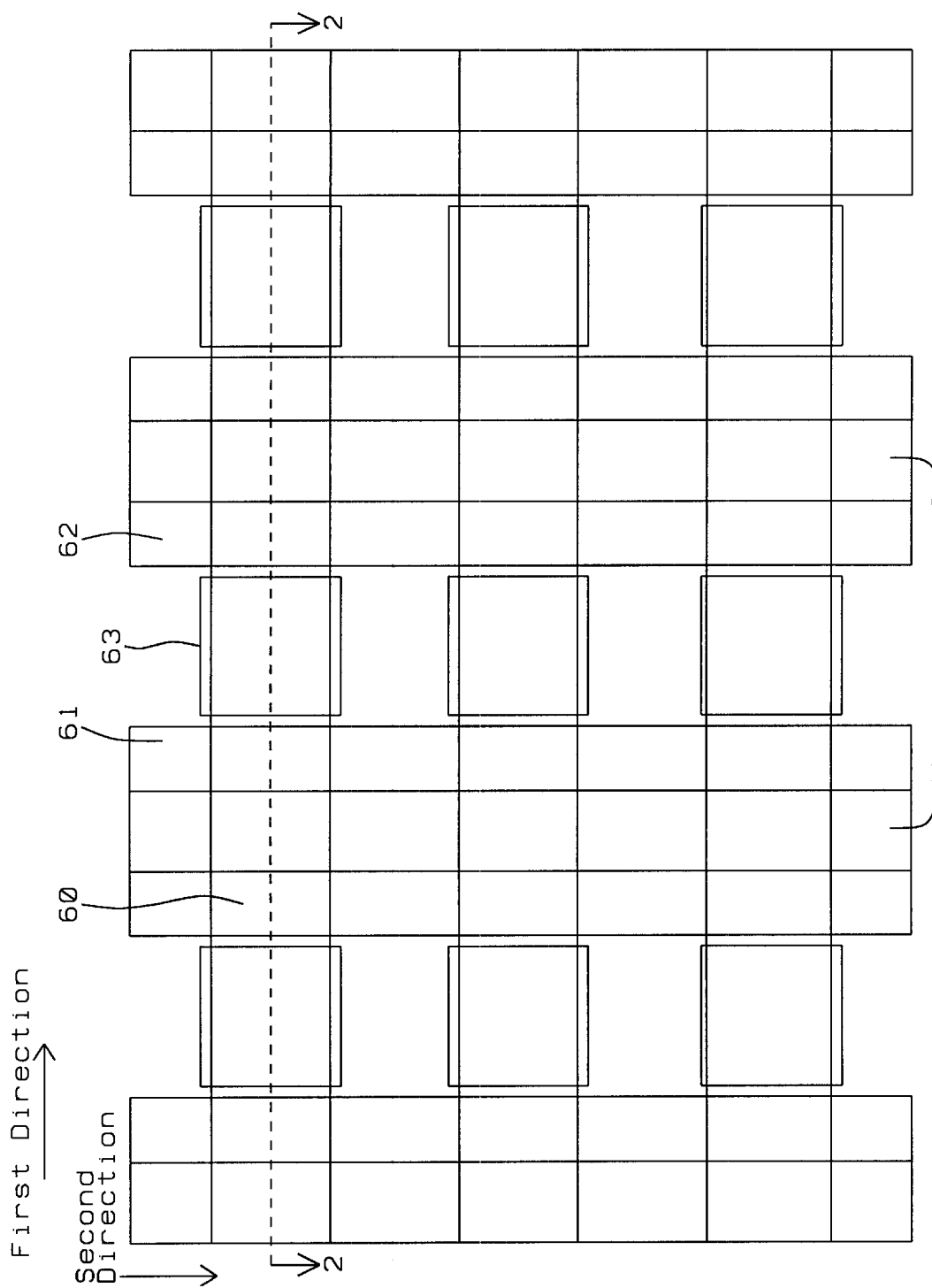
FIG. 1 – Prior Art

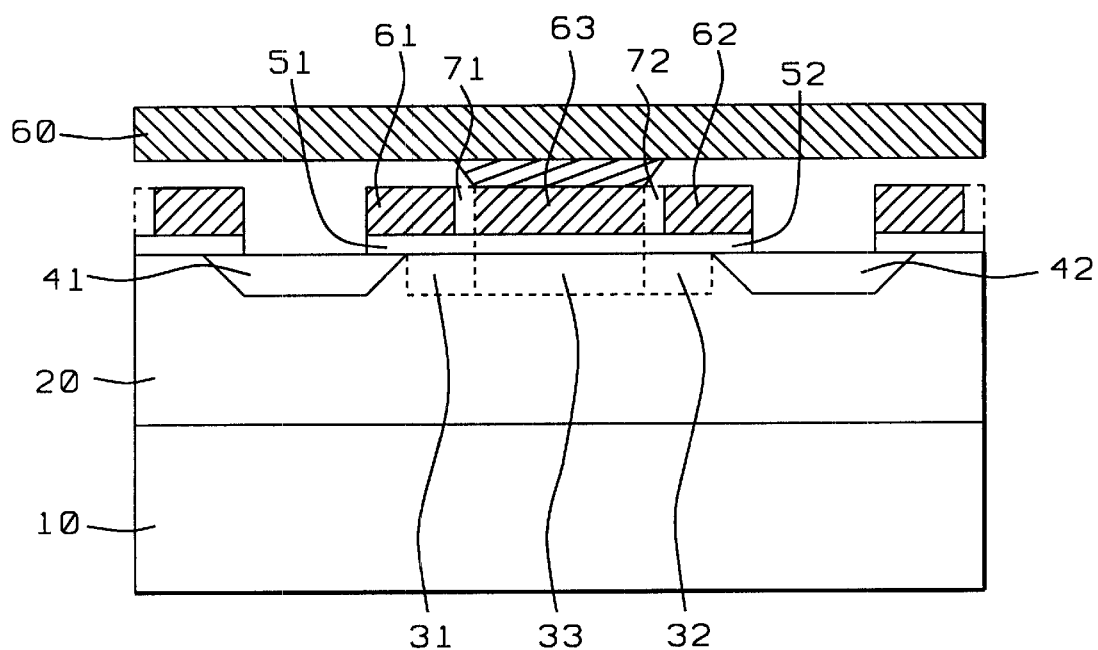
FIG. 2 - Prior Art

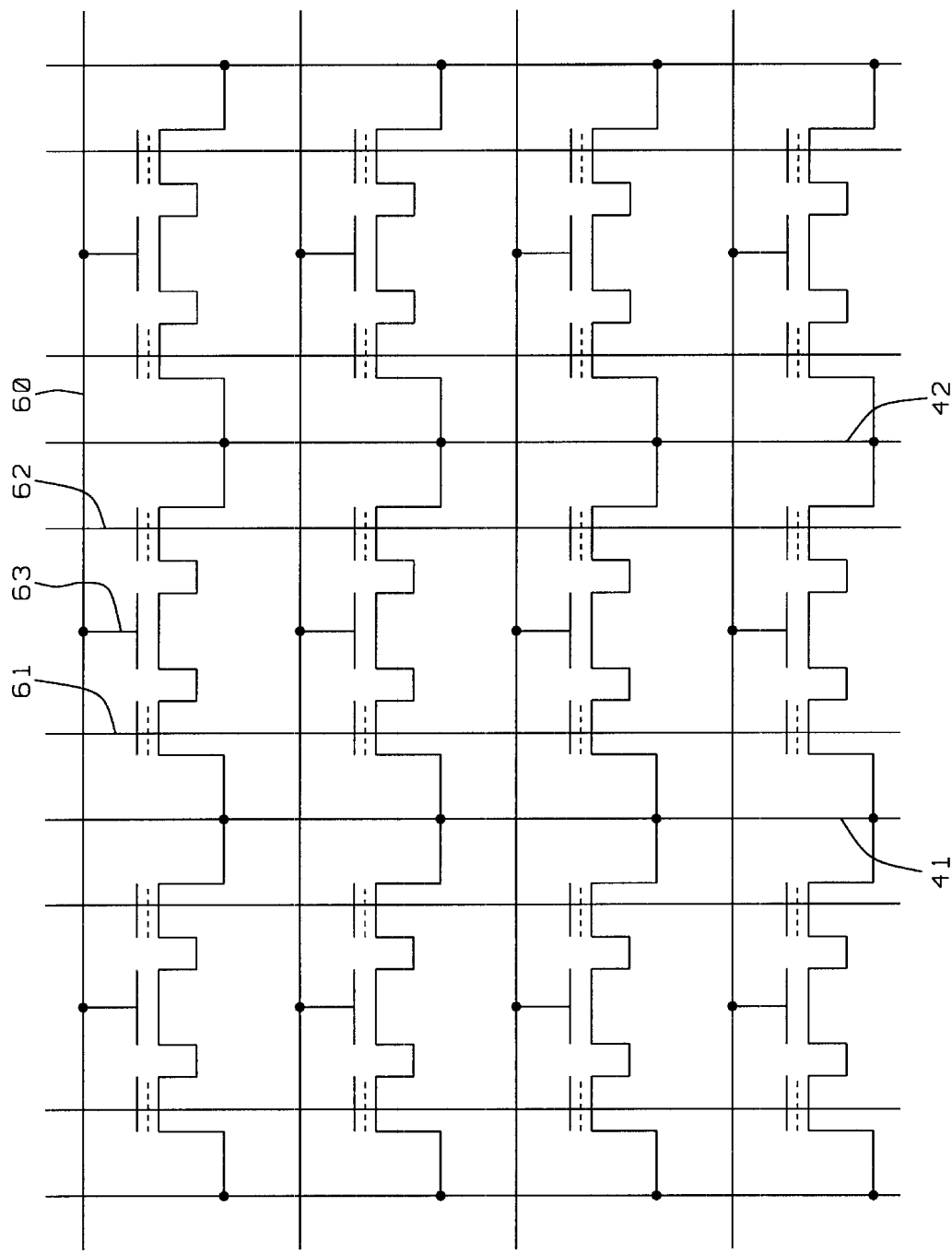
FIG. 3 – Prior Art

ARRAY ARCHITECTURE NONVOLATILE MEMORY AND ITS OPERATION METHODS

BACKGROUND OF THE INVENTION

1. Field of the Invention

This invention relates to a nonvolatile memory, more specifically to array structures and operation methods of the same. The "operation methods" means programming (write and/or erase) and read methods.

2. Description of Related Art

In the U.S. patent application specifications No. 60/147,258 filed on Aug. 5, 1999 and No. 60/158,966 filed on Oct. 12, 1999, array structures of nonvolatile memory are described. In the prior patent applications there was described an array of a nonvolatile memory of prior art constructed of a plurality of the cells. A planar view of the nonvolatile memory of prior art is shown in FIG. 1. The array is two dimensionally disposed, in a first direction and in a second direction. A first set of bit lines 41 and a second set of bit lines 42 extend in the second direction and are continuously connected. The regions 41 and 42 of opposite conductivity are shared with neighboring cells in the first direction. A conductive word line 60 extends in the first direction and stitches a row of third conductive gates 63 together, across and over the opposite conductivity type regions. An example of processing technology for stitching the third conductive gates 63 was described in the patent application No. 60/158,966. Control lines are formed from conductive gates 61 and 62 extending in the second direction and are continuously connected.

A cross section view of a portion of FIG. 1 is shown in FIG. 2. A memory cell is shown with a channel forming a semiconductor region 31, 32 and 33 of a first conductivity type in a surface region 20 called a well on or in one surface of a substrate 10. The substrate 10 is a semiconductor substrate, or has a semiconductor surface layer 20 on an insulating substrate. A first opposite conductivity type region 41 and a second opposite conductivity type region 42 are disposed in the surface 20 of the substrate 10. The first and second opposite conductivity type regions 41, 42 are spaced apart and separated from each other by the channel forming semiconductor region 31, 32 and 33. The channel forming semiconductor region 31, 32 and 33 contain a first channel forming region 31 laterally contacting the first opposite conductivity type region 41, a second channel forming region 32 contacting the second opposite conductivity type region 42, and a third channel forming region 33 disposed between and in contact with the first and second channel forming regions 31, 32. A first gate insulator 51 is disposed on the first channel-forming region 31, and a second gate insulator 52 disposed on the second channel-forming region 32. A third gate insulator 53 is disposed on the third channel-forming region 33. A first conductive gate 61 is formed on the first gate insulator 51, a second conductive gate 62 is formed on the second gate insulator 52, and a third conductive gate 63 is formed on the third gate insulator 53. The first, second and third conductive gates 61, 62 and 63 are electrically insulated each other with an insulator 71 and 72. Carrier trapping sites are contained within gate insulators for carrier storage and are provided in the first insulator 51 and second insulator 52.

It can be recognized from FIG. 1 that the high bit density of $3F^2$/bit is possible when the conductive first and second gates are fabricated by a side wall gate technology as was shown in the patent application No. 60/158,966. However, to utilize this array in a fast read application under low supply voltage (e.g. Vdd=1.8V), read current per cell is set to be 10~40 micro-ampere. On the other hand, series resistance of the bit line being comprised of the continuously connected opposite conductivity type regions is about 400 ohm/cell and voltage drop per cell in the bit line amounts to 4~16mV/cell. In case that 20% voltage drop on the bit line is allowed, only 23~90 cells can be connected through one bit line. For an array structure larger than 128 bit/bit-line, the opposite conductivity type regions silicided on the top and/or a metal layer stitching every tens (hundreds for the silicided opposite conductivity type regions) of cells is necessary. However, once the metal layer is used for array connection, the above estimated high bit density of $3F^2$/bit becomes difficult, because usually metal layer pitch is (about 1.4 times) larger than that of a poly-silicon layer. Also the technology cited above for stitching the third conductive gates by one of the word lines is not logic compatible (ie. not compatible with a fabrication process for a MOS logic LSI). For a reasonably high density and/or improved logic compatibility, a new array structure is necessary.

Referring to FIG. 3, an equivalent circuit is shown of the array in FIG. 1. As is seen in FIG. 3, control lines 61 and 62 along with bit lines 41 and 42 cross the word lines 60. When a selected memory cell is written, read or erased, the control lines give a bias voltage(s) to the first and second gates of all unselected cells that are connected to the control lines, causing the unselected cells to suffer from repetitive write disturb, read disturb or erase disturb.

SUMMARY OF THE INVENTION

It is a purpose of the present invention to provide a nonvolatile memory array structure having low bit line resistance but still reasonable high cell density. It is another purpose of the present invention to provide a nonvolatile memory array having improved logic process compatibility. It is further another purpose of the present invention to provide an operation method of the nonvolatile memory array. The "operation method" includes "write", "erase" or "read" methods. It is further another purpose of the present invention to provide an array structure with improved write, read or erase disturb.

To achieve the above purpose, the following array structure is provided in the present invention. A bit line extends in a first direction and comprises of a high conductive layer, such as a metal layer or a TiN or tungsten layer for a local interconnection. The "high conductive" layer is defined as a layer whose conductivity is higher than that of the opposite conductivity type region. A connection region is provided to connect opposite conductivity type regions neighboring in a second direction, each one of which is shared by two neighboring memory cells extending in the first direction. The connection region is connected to the bit line, thus 4 cells are connected to one bit line through the connecting region and a high-density array structure is obtained. The connection region can be continuously formed to the opposite conductivity type regions and/or simultaneously formed with opposite conductivity type regions for the economy of the processing steps. The connection region can also be a polysilicon layer which contacts the opposite conductivity type region and insulated from a first and second conductive gates mentioned below. This new architecture eliminates the necessity of the word line to cross over the opposite conductivity type regions, which is incompatible with a logic process.

More specifically, the present invention is summarized as a nonvolatile memory array comprising; a plurality of memory cells two dimensionally disposed in a first direction and in a second direction having connection regions with conductive bit lines extending in the first direction, conductive word lines extending in the second direction, and conductive control lines extending in the second direction. The memory cell comprises a channel forming semiconductor region of a first conductivity type in a semiconductor surface region of a substrate where the substrate is a semiconductor substrate itself, or a semiconductor surface region on an insulating substrate, such as silicon on insulator (SOI). The memory cell also comprises a first opposite conductivity type region and a second opposite conductivity type region being disposed in the surface region of the substrate and the first and second opposite conductivity type regions being spaced apart and separated from each other by the channel forming semiconductor region.

The channel forming semiconductor region further comprises a first channel forming region laterally contacting the first opposite conductivity type region, a second channel forming region contacting the second opposite conductivity type region, and a third channel forming region in contact with the first and second channel forming regions and disposed between the first channel forming region and the second channel forming region. The gate insulators comprise a first gate insulator disposed on the first channel forming region and a part of the first opposite conductivity type region adjacent to the first channel forming region, a second gate insulator disposed on the second channel forming region and a part of the second opposite conductivity type region adjacent to the second channel forming region, and a third gate insulator disposed on the third channel forming region. The conductive gates comprise a first conductive gate on the first gate insulator, a second conductive gate on the second gate insulator, and a third conductive gate on the third gate insulator. The first, second and third conductive gates are electrically insulated from each other, and a part of the first conductive gate overlaps a part of the first opposite conductivity type region via the first insulator. A part of the second conductive gate overlaps over a part of the second opposite conductivity type region via the second insulator. Carrier trapping sites for carrier storage are provided in the first and second insulator.

The connection regions comprise a first connection region and a second connection region. The first connection region electrically connects the first opposite conductivity type regions of two neighboring cells in the second direction. The second connection region electrically connects the second opposite conductivity type region of one of the cells and a second opposite conductivity type region of a neighboring cell in the second direction. The first connection region is connected to a first high conductive layer that is insulated from and crosses over the first, second and third conducting gates. The second connection region is connected to a second high conductive layer that is insulated from and crosses over the first, second and third conducting gates. The first and second high conductive layers form bit lines.

The connection regions can be of opposite conductivity type semiconductor regions. More specifically, the connection regions can be formed continuously in opposite conductivity type semiconductor regions of the memory cells that will be connected to the connection regions. The connection regions can be poly-silicon layers partly over but insulated from the first or second conductive gates. The third gate of each cell is disposed side-by-side in the second direction and is continuous, connecting third gates of other cells together and forming a part of one word line out of the plurality of word lines. The first gate of each cell is disposed side-by-side in the second direction and is continuous, connected to other first gates, and forming a part of a first control line out of the plurality of control lines. The second gate of each cell is disposed side-by-side in the second direction, and is continuous, connected other second gates, and forming a part of a second control line out of the plurality of control lines.

A word line is made from poly-silicon by continuously connecting the third gates. Reduction of the word line resistance can be realized by stitching the word line at each tens or hundreds of cells by a metal layer commonly utilized in a multi-layer interconnection technology. To stitch a control line by a metal layer, a "bridging" layer is provided in the present invention. The "bridging" layer bridges neighboring control gates and connects the neighboring control gates in the first direction. The bridging layer can be made from poly-silicon In order to operate the present array architecture, a new operation algorithm is provided, in the present invention, for writing and reading the array, that is called, "split write" and "split read". The split write employs three bit lines for writing a pair of hard bits in the cells sandwiched by the two bit lines. A center bit line is biased to a voltage for the acceleration-injection of electrons and the bit lines to either side of the center bit line of the three bit lines are biased to a write-inhibit voltage or a write-select voltage. The write-select voltage can be 0V for 2 level storage, but can be selected from of a multiple of voltages, e.g. 0, 0.5, 1, 1.5V, for setting a storage level in a multilevel storage. Each bit-line adjacent to the selected triplet of bit lines is idled by a bias voltage from 0V to the write-inhibit voltage. Thus every other two hard bits are written.

A split read also employs three bit lines for sensing a pair of hard bits in two cells sandwiched between the two outside bit lines of the selected three bit lines. A center bit line is biased to a read selection voltage, can be 0V for 2 level storage, but can be selected out of a multiple voltages for multilevel sensing. The bit lines on the outside of the selected three bit lines are used for sensing by applying a read voltage. The sensing can be done by either detecting current value through the bit lines or discharge time on pre-charged bit lines. Each bit-line adjacent to the selected triplet of bit lines is idle and biased to a read-inhibit voltage. Thus every other two hard bits are sensed.

The detailed explanation of the algorithm through embodiments will be given after the following explanation of embodiment of array architectures according to the present invention.

BRIEF DESCRIPTION OF THE DRAWING

FIG. 1 shows an example of prior art of the planar view of a nonvolatile memory array, FIG. 2 is a cross section of the nonvolatile memory cell of prior art of FIG. 1 that shows a word line crossing over opposite conductivity type regions, FIG. 3 is a circuit diagram of the array of prior art shown in FIG. 1.

DETAILED DESCRIPTION OF THE PREFERRED EMBODIMENTS

Figure 4A:
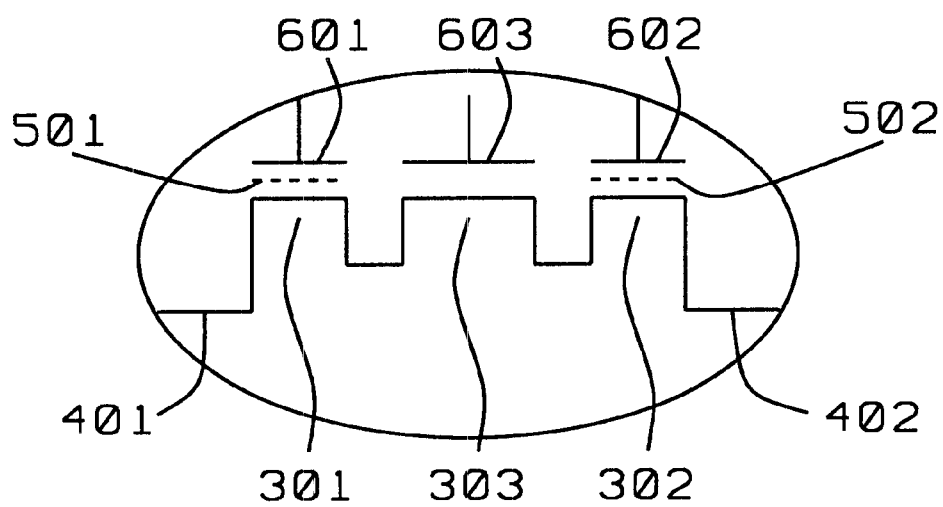
FIG. 4a is a circuit diagram of a unit cell of the present invention.

FIG. 4a shows a schematic diagram of a memory cell of the present invention. A first channel region 301 is adjacent to a first opposite conductivity region 401. A second channel region 302 is adjacent to a second opposite conductivity region 402. The first opposite conductivity region 401 forming a part of first bit line, and the second opposite conductivity region 402 forming a part of a second bit line. A first gate insulator 501 lying on top of the first channel region 301 upon which is a first conductive gate 601. A second gate insulator 502 lying on top of the second channel region 302 upon which is a second gate conductive gate 602. A third conductive gate 603 lying above the third channel region 303. Gates 601 and 602 connect to control lines in the memory shown in FIG. 2b and gate 603 connects to a word line. Data stored in the memory cell is stored in the form of charge in the first and second insulators 501 and 502.

Figure 4B:
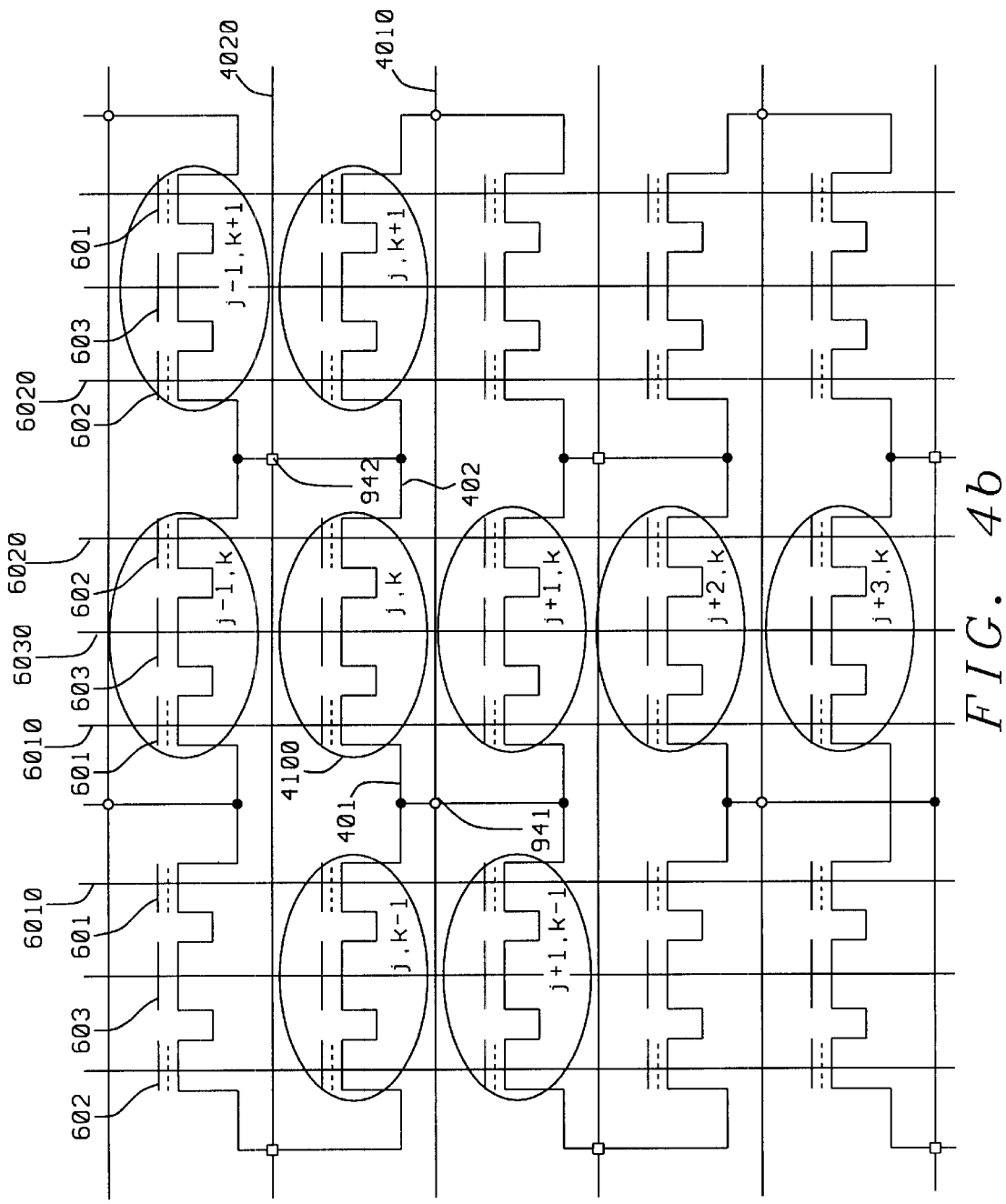
FIG. 4b is a circuit diagram of a nonvolatile memory array of the present invention, the present invention.

In FIG. 4b is shown a schematic diagram of a portion of a memory of first embodiment of the present invention configured using the memory cell shown in FIG. 4a. The memory cell of FIG. 4a is replicated in the horizontal or first direction and in the vertical or second direction. The discussion pertaining to FIG. 4b will be centered around memory cell (j,k) 4100 and adjacent cells, but is applicable all cells. The memory cells in each column are mirror images of the memory cells in the adjacent columns. Thus, memory cells (j,k−1) and (j,k); (j+1,k−1) and (j+1,k); (j,k+1) and (j,k); and (j−1,k+1) and (j−1,k) are mirror image of each other. Bit line 4010 is connected to the first opposite conductivity region 401 of cells (j,k), (j,k−1), (j+1,k), and (j+1,k−1) as signified by the "round dot" at the intersection of the bit line 4010 and the connections to the first opposite conductivity regions 401. Bit line 4020 is connected to the second opposite conductivity region 402 of cells (j,k), (j,k+1), (j−1,k), and (j−1,k+1) as signified by the "square dot" at the intersection of the bit line 4020 and the connections to the second opposite conductivity regions 402. Each bit line connects to memory cells in groups of four that are adjacent in the first and the second directions. For example, in FIG. 4b bit line 4010 connects to the opposite conductivity region 401 associated with cells (j,k), (j+1,k), (j,k−1) and (j+1,k−1) using connection via 941, and bit line 4020 connects to the opposite conductivity region 402 associated with cells (j,k), (j−1,k), (j,k+1) and (j−1,k+1) using connection via 942.

Continuing to refer to FIG. 4b, control line 6010 connects to the first control gates 601 in each of the cells in a column, control line 6020 connects to the second control gates 602 in each column, and word line 6030 connects to the third gate in each of the cells in a column. Since columns are mirror images of each other, control lines 6010 connecting first control gates 601 in two adjacent columns are close to each other, and on the opposite side of a column, control lines 6020 connecting second control gates 602 are close together. Bit lines 4010 and 4020 run across control lines 6010 and 6020 and word lines 6030. Word lines and control lines run in the second direction and orthogonal to the bit lines 4010 and 4020 that run in the first direction. The layout as depicted in FIG. 4b minimizes disturb conditions between word lines 6030 and control lines 6010 and 6020 because the word lines do not cross the control lines.

Figure 5:
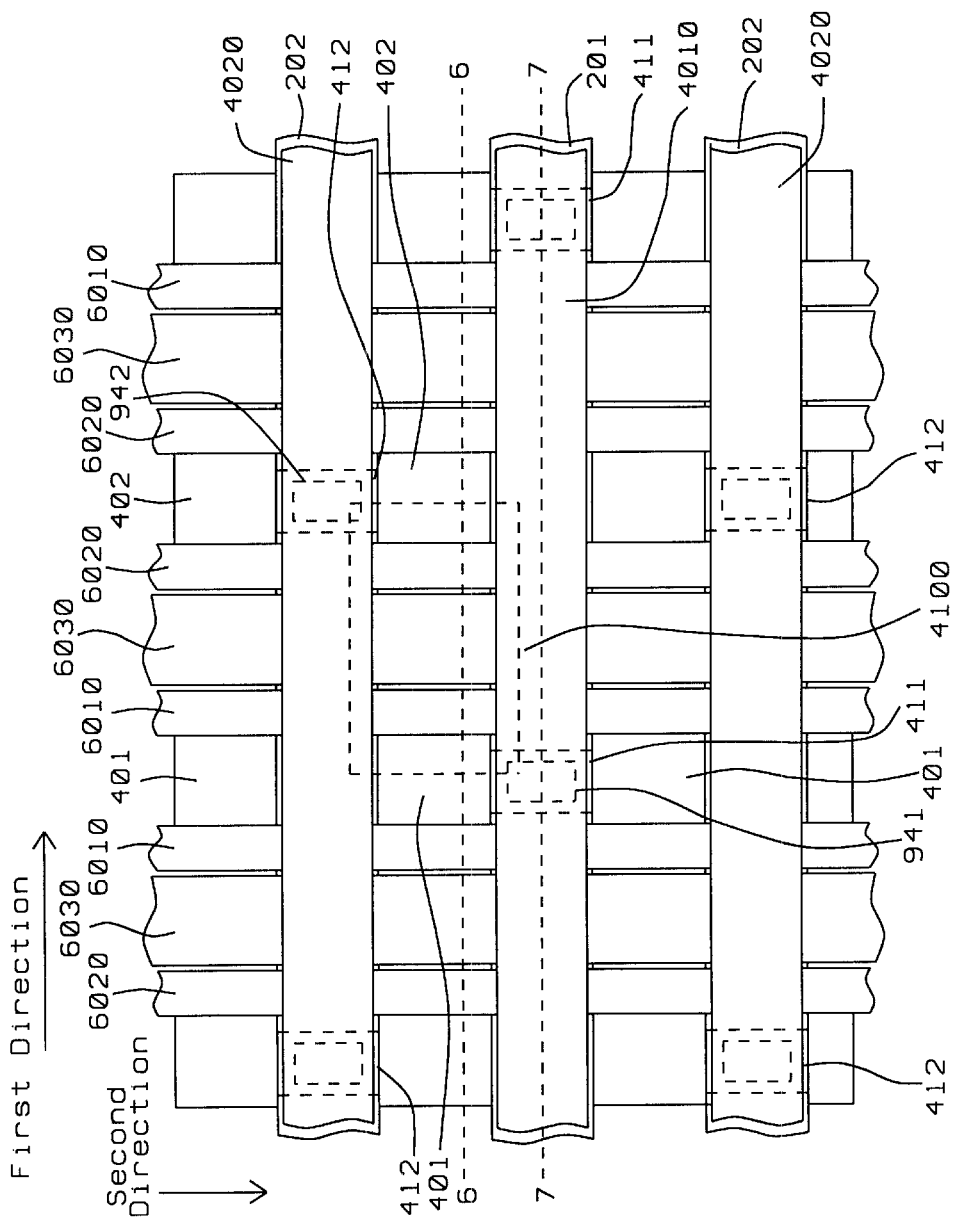
FIG. 5 is a planar view of a first embodiment of a nonvolatile memory array according to the present invention.

FIG. 5 shows a plan view of the first embodiment of the present invention. The memory cell (j,k) 4100 is shown in the center of the plan view and is the same as other cells that are in the second direction in the same column above and below cell (j,k). The designation (j,k) represents the location at the cell within the memory where "j" is the row designation and "k" is the column designation. Cells in columns on either side of cell (j,k) are mirror images of cell (j,k). This places the control lines 6010 in the column of cell (j,k) and the column (k−1) to the left dose together. Also control lines 6020 of the column containing cell (j,k) and control line 6020 of the column (k+1) to the right of cell (j,k) are dose together. Control lines 6010 and 6020 in each column extend in the second direction connecting to gates 601 and 602, respectively, of the cells in each column. Word line 6030 connects to gate 603 in each cell in a column and extends in the second direction between control lines 6010 and 6020.

Continuing to refer to FIG. 5, a first insulator 201 extends in the first direction over which the control lines 6010 and 6020 and word line 6030 are formed in the second direction making the control lines and the word lines each continuous in a column. A bit line 4010 extends across the memory in the first direction and is located over the first insulator 201. The bit line lies across the control lines 6010 and 6020 and the word line that cross over the first insulator 201. The first insulator 201 is made of material such as silicon oxide in or on the surface of the substrate. A second insulator 202 extends in the first direction over which the control lines 6010 and 6020 and word line 6030 are formed in the second direction making the control lines and the word lines each continuous in a column. A bit line 4020 extends across the memory in the first direction and is located over the second insulator 202. The bit line lies across the control lines 6010 and 6020 and the word line 6030 that cross over the second insulator 202. The insulator 202 is made of material such as silicon oxide in or on the surface of the substrate.

Continuing to refer to FIG. 5, the first insulator 201 is interrupted by a first connection region 411 on which a filled contact hole 941 is located. The filled contact hole 941 allows the bit line 4010 to be connected to the two regions of opposite conductivity 401 disposed between control lines 6010 in adjacent columns of cells. The two regions of opposite conductivity 401, which extend in the second direction between two-second insulators 202 and lie between two adjacent control lines 6010, are connected by the connection region 411. The two regions of opposite conductivity 401 and one first connection region are associated with four memory cells, (j,k) (j+1,k) (j,k−1) and (j+1,k−1), as shown in FIG. 4b. The second insulator 202 is interrupted by a second connection region 412 on which a filled contact hole 942 locates. The filled contact hole 942 allows the bit line 4020 to be connected to the two regions of opposite conductivity 402 disposed between control lines 6020 in adjacent columns of cells. The two regions of opposite conductivity 402 extend in the second direction between two first insulators 201 and are associated with four memory cells, (j,k) (j−1,k) (j,k+1) and (j−1,k+1) by means of one second connection region, as shown in FIG. 4b. The first connection region can be continuously formed with the first opposite conductivity regions to be connected and is of opposite conductivity type. The second connection region can be continuously formed with the second opposite conductivity regions to be connected and is of opposite conductivity type.

Figure 6:
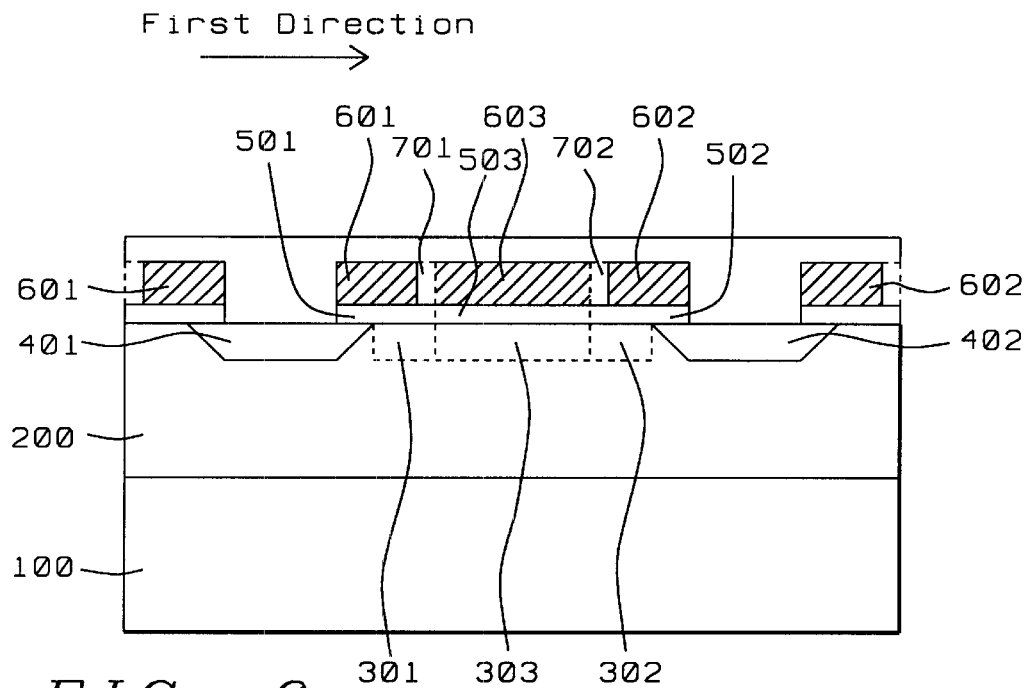
FIG. 6 is a first cross section of the first embodiment shown in FIG. 5.

Referring to FIG. 6, a cross sectional view of FIG. 5 taken through the area of a memory cell (j,k) and comprises a channel forming semiconductor region 301, 302, and 303 of a first conductivity type in a surface semiconductor region 200 as a well or a semiconductor layer on a insulating substrate 100. The substrate 100 is either a semiconductor substrate or an insulating substrate on which a semiconductor surface region 200 is disposed. A first opposite conductivity type region 401 and a second opposite conductivity type region 402 is disposed in the surface semiconductor region 200 of the substrate 100 and the first and second opposite conductivity type regions 401 and 402 are spaced apart and separated from each other by a channel forming semiconductor region comprising regions 301, 302 and 303. The first channel forming region 301 laterally contacting the first opposite conductivity type region 401, the second channel forming region 302 contacting the second opposite conductivity type region 402, and the third channel forming region 303 in contact with the first and second channel forming regions 301 and 302 and disposed between the first channel forming region and the second channel forming region.

Continuing to refer to FIG. 6, a first gate insulator 501 is disposed on the first channel forming region 301 and on a part of the first opposite conductivity type region 401 adjacent to the first channel forming region 301. A second gate insulator 502 is disposed on the second channel forming region 302 and on a part of the second opposite conductivity type region 402 adjacent to the second channel forming region 302, and a third gate insulator 503 is disposed on the third channel forming region 303. First carrier trapping sites are embedded in the first gate insulator 501 and second carrier trapping sites are embedded in the second gate insulator 502. The carrier trapping sites are embodied by small conductive particles embedded in the insulator (like silicon particles in silicon dioxide) or by three layered insulator with a lower gap insulator layer as middle layer and with a higher gap insulators as top and bottom layer (like silicon dioxide/silicon nitride/silicon oxy-nitride or silicon dioxide). Conductive gates comprise a first conductive gate 601 on the first gate insulator 501, a second conductive gate 602 on the second gate insulator 502, and a third conductive gate 603 on the third gate insulator 503. The first, second and third conductive gates are electrically insulated from each other by insulators 701 and 702. A portion of the first conductive gate 601 overlaps a portion of the first opposite conductivity type region 401 by means of the first insulator 501. A portion of the second conductive gate 602 overlaps a portion of the second opposite conductivity type region 402 by means of the second insulator 502. Hot carriers are trapped in the trapping sites located in the first and second insulators 501 and 502. Charging state of the trapping sites is changed by the carrier charge.

Figure 7:
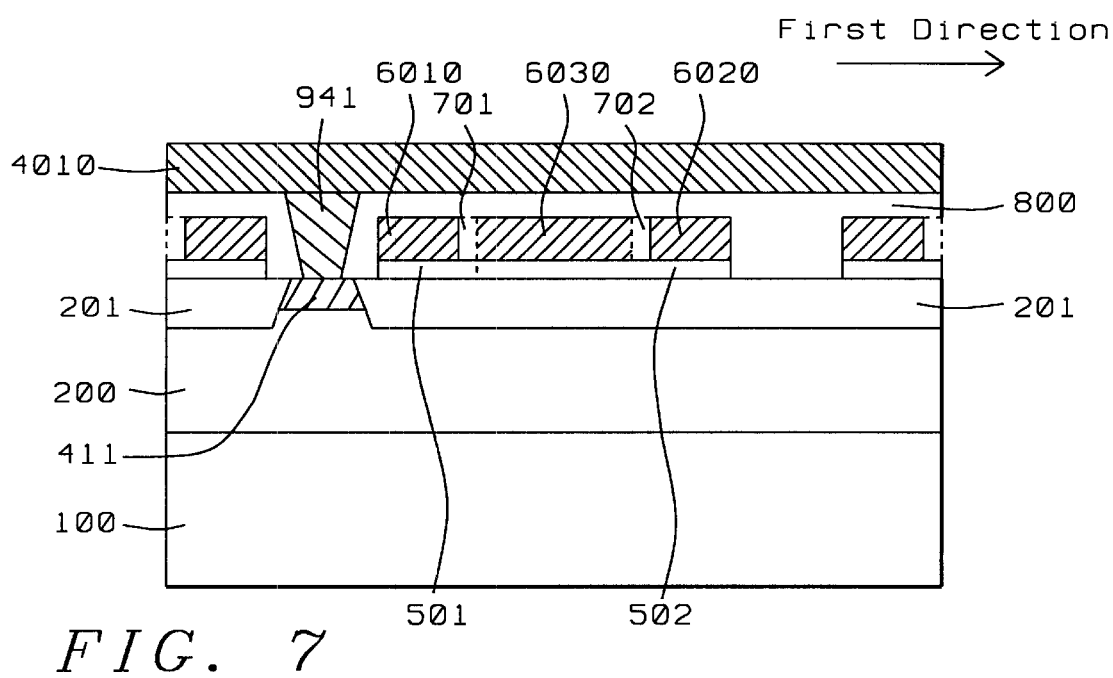
FIG. 7 is a second cross section of the first embodiment shown in FIG. 5.

In FIG. 7 is shown a cross section of the first embodiment shown in FIG. 5 taken along bit line 4010. The bit line 4010 is a high conductive layer (made of AlCu, TiN, W or Cu etc) that crosses over the first control line 6010 connected to the first conductive gate 601, the second control line 6020 connected to the second conductive gate 602 and the word line 6030 connected to the third conductive gate 603. An inter-insulating layer 800 made of silicon oxide or a multi-layer of silicon nitride and silicon oxide in-between is used to separate the bit line 4010 from the control lines 6010 and 6020 and the word line 6030. An insulating area 201 residing within the semiconductor surface region 200 extends in the first direction under bit line 4010. A first connection region 411 extends in the second direction through the insulating area 201. The bit line 4010 is electrically connected to the region of opposite conductivity 401 through the filled contact hole 941 in the inter-insulating layer 800 via the first connection region 411. W or AlCu are used to fill the contact hole 941.

Figure 8:
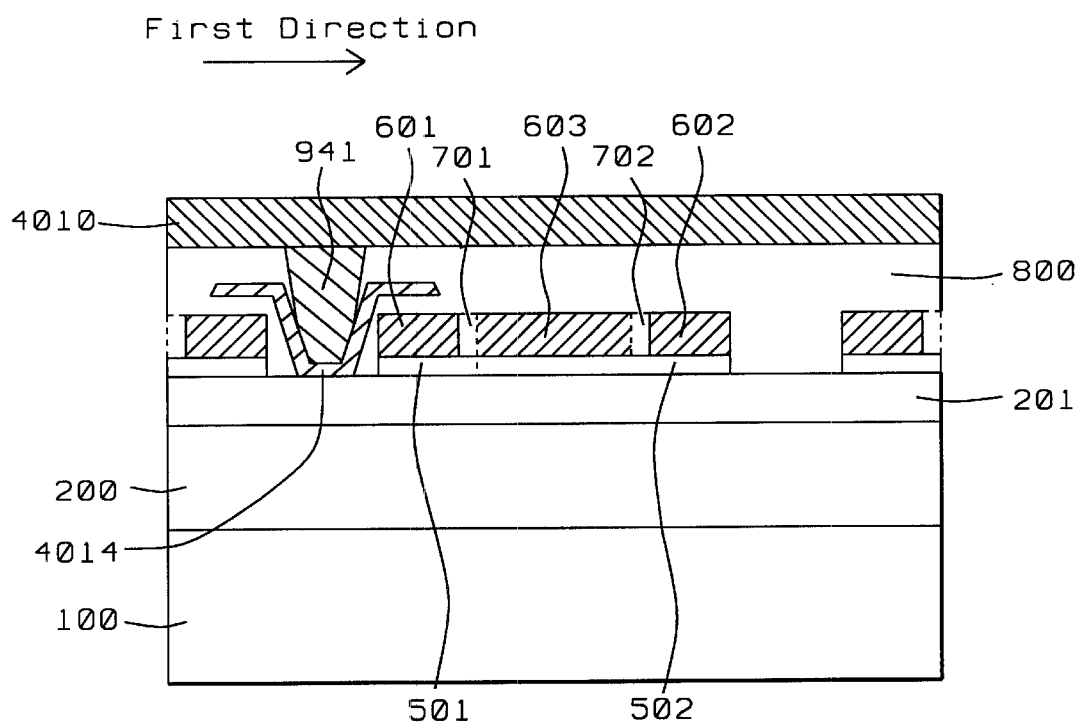
FIG. 8 is a cross section of a second embodiment where the connection region comprises a poly-silicon layer.

FIG. 8 is a cross section of an embodiment where the connection region comprises a poly-silicon layer 4014. The poly-silicon layer contacts the two adjacent opposite conductivity type regions neighboring in the second direction on either side of the insulating area 201 and extends over but is insulated from the control gates 601. The poly-silicon layer is doped with an impurity preferably of the opposite type conductivity. This poly-silicon connection region can accept a large size contact plug 941 and ease alignment of the contact plug 941 to the first 601 or the second 602 conductive gate, because the poly-silicon layer covers the first 601 or the second 602 gate. When a first opposite conductivity type region 401 is shared with two cells adjacent in the first direction, a first shared opposite conductivity type region 401 is connected by the connection region 4014 to a second shared opposite conductivity type region 401. A bit line is thus connected to four cells in the two opposite conductivity regions 401 by means of a contact plug 941. This makes a high-density array layout possible. A word line 6030 comprises poly-silicon or polycide with a double layer of a tungsten silicide layer on a poly-silicon layer, and continuously connects third gates 603 in a column together. Reduction of the word line resistance can be realized by stitching the word line at each tens or hundreds of cells by an additional conductive metal layer that is commonly utilized in a multi-layer interconnection technology.

Figure 9:
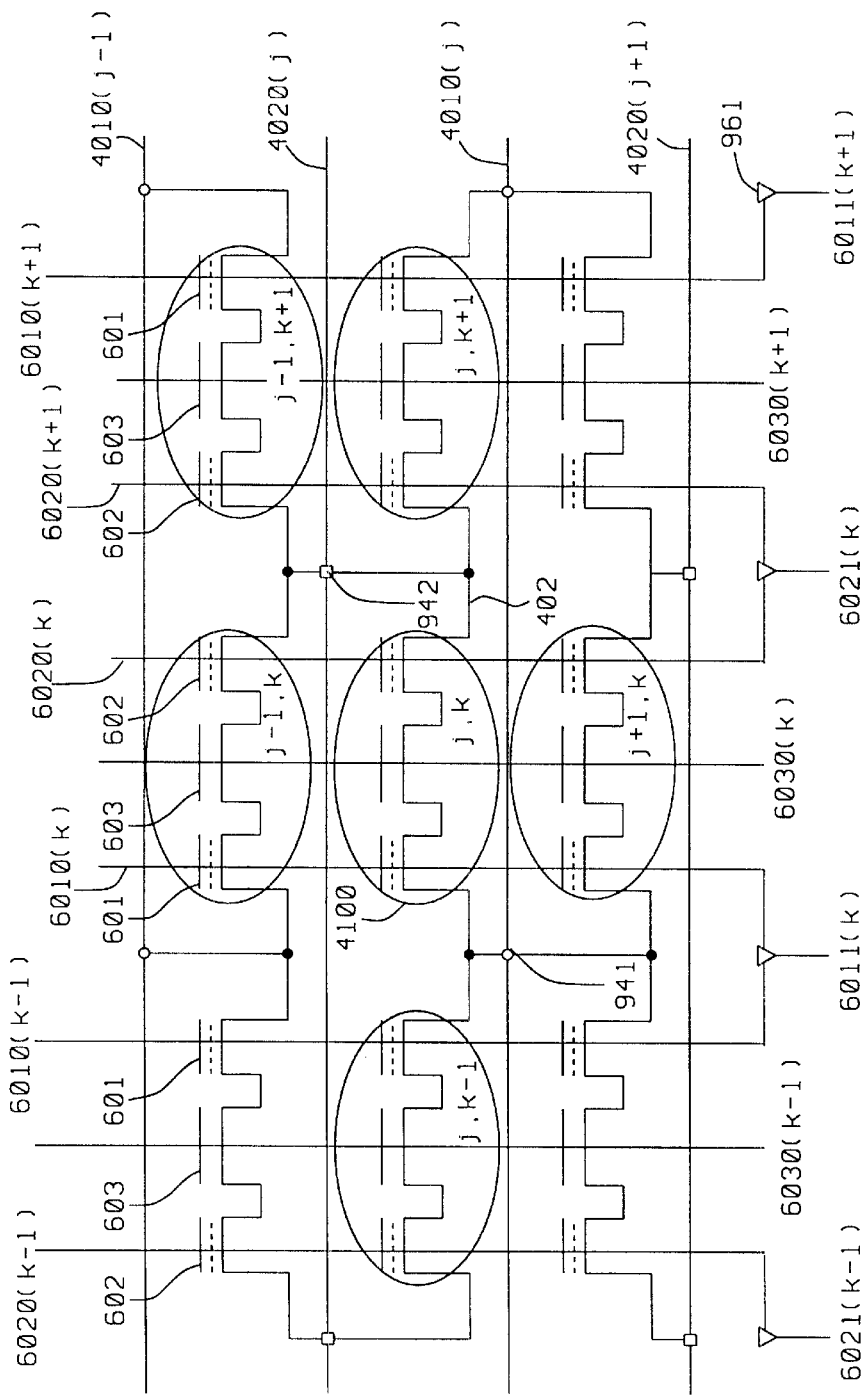
FIG. 9 is a circuit diagram of the present invention showing the forming of main control lines by means of a bridging layer and a numbering scheme for the non-volatile memory array.

In FIG. 9 is shown the schematic diagram of the preferred embodiment of the present invention that is similar to the schematic diagram of FIG. 4b. In FIG. 9 bit lines, word lines, control lines and main control lines are renumbered using "j" and "k" subscripts, for instance bit lines 4010(j−1), 4010(j), 4010(j+1)(not shown), 4020(j), 4020(j+1), 4020(j+ 2)(not shown), word lines 6030(k−1), 6030(k), 6030(k+1), control lines 6010(k−1), 6010(k), 6010(k+1), 6020(k−1), 6020(k), 6020(k+1) and main control lines 6011(k), 6011 (k+1), 6021(k−1), and 6021(k). Adjacent control lines 6020 (k−1) and 6020(k−2) (not shown) are connected together and further connected to a main control line 6021(k−1) by means of a filled contact hole 961 (symbolized with triangular dot). Adjacent control lines 6010(k−1) and 6010(k) are connected together and further connected to a main control line 6011(k) by means of a filled contact hole 961. Adjacent control lines 6020(k) and 6020(k+1) are connected together and further connected to a main control line 6021(k) by means of a filled contact hole 961. Adjacent control lines 6010(k+1) and 6010(k+2) (not shown) are connected together and further connected to a main control line 6011(k+1) by means of a filled contact hole 961.

Figure 10:
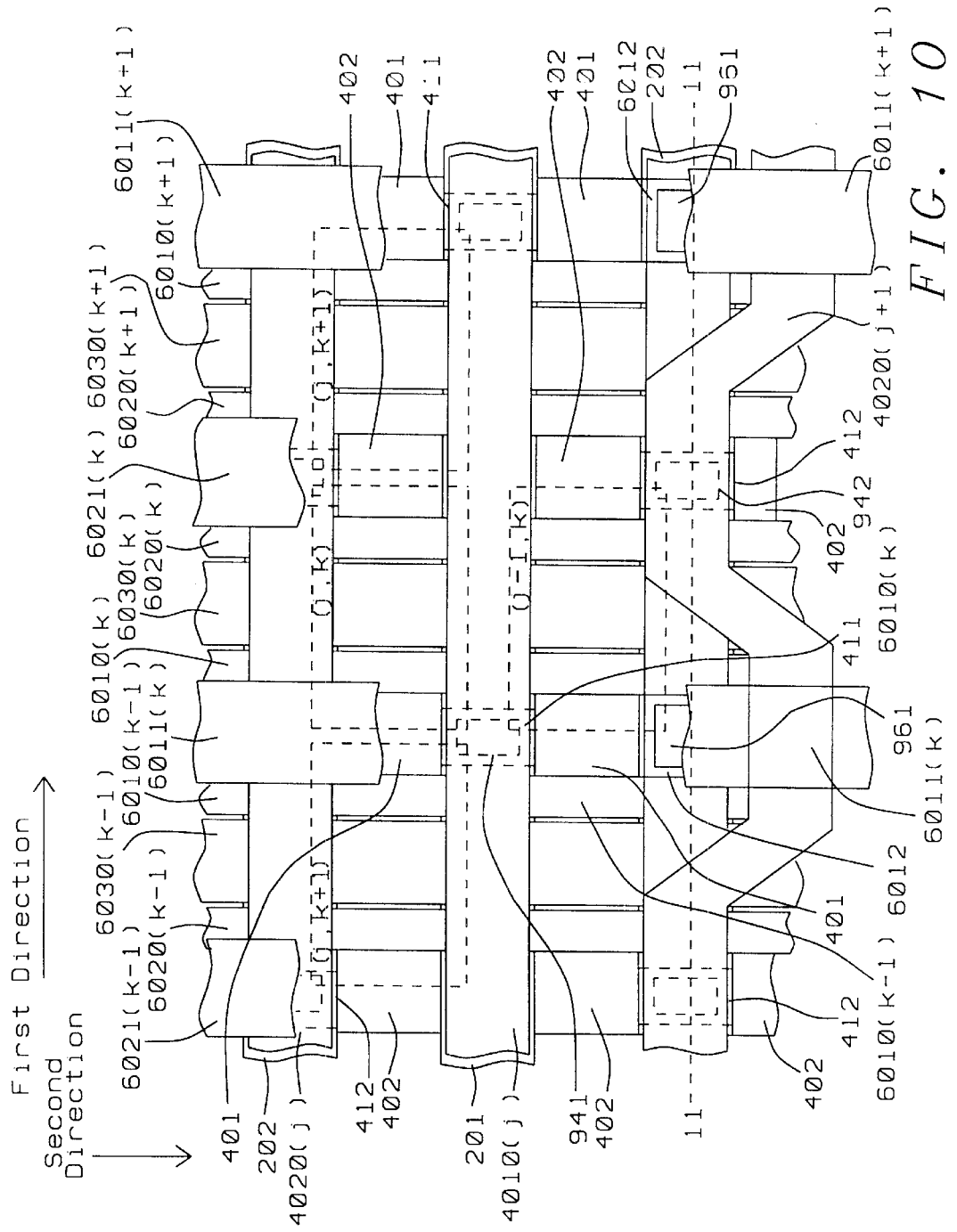
FIG. 10 is a planar view of an example of the bridging layer bridging two control lines.

Referring to FIG. 10, a plan view of a portion of the nonvolatile memory of the present invention is shown. A representative set of memory cell locations 4100 are shown with the designation (j,k), (j+1,k), (j,k−1) and (j,k+1). Control lines, which are shown, are labeled 6020(k−1), 6010(k−1), 6010(k), 6020(k), 6020(k+1) and 6010(k+1) and word lines shown are labeled 6030(k−1), 6030(k) and 6030(k+1). The control lines and the word lines extend in the second direction laying overt the respective gates and the isolation areas 201 and 202. Bit lines that are shown are labeled as 4010(j), 4020(j) and 4020(j+1) and extend in the first direction and lie over the isolation areas 201 and 202 and over the control lines and word lines. The labeling is used to provide understanding of the circuitry and for reading and writing methods that will be described later.

Continuing to refer to FIG. 10, main control lines 6011(k), 6011(k+1), 6021(k−1) and 6021(k) are shown. The main control lines are a result of stitching an additional conductive layer to adjacent control lines, e.g. main control line 6011(k) stitched to control lines 6010(k−1) and 6010(k) and main control line 6011(k+1) stitched to control lines 6010(k+1) and 6010(k+2) (not shown). To accomplish the stitching, a bridging layer 6012 is inserted between adjacent control lines at the point of stitching. The bridging layer connects the two adjacent control lines 6010(k−1) and 6010(k) together and creates a platform for a filled contact hole 961 to form a connection between the bridging layer 6012 and the main control line 6011(k). To accommodate the stitching, bit line 4020(j+1) is jogged around the area of the bridging layer 6012 and the filled contact hole 961. The material used to fill the contact hole can be W or AlCu. Although not shown in FIG. 10, main control line 6021(k−1) is stitched to control lines 6021(k−2) and 6021(k−1) and main control line 6021(k) is stitched to control lines 6021(k) and 6021(k+1) by similar means shown for stitching main control line 6011(k).

Figure 11:
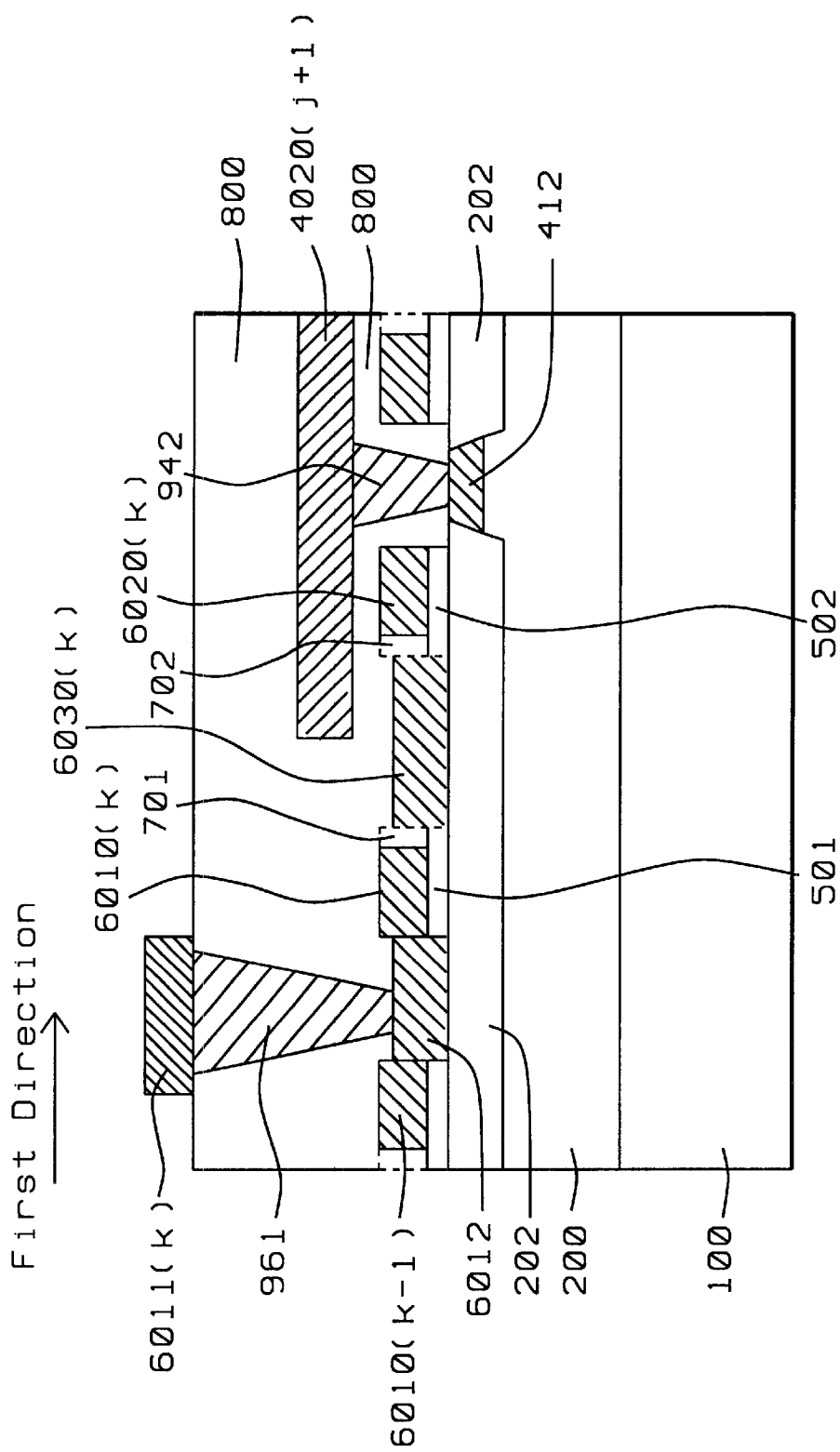
FIG. 11 is a cross section view of the bridging layer shown in the planar view in FIG. 9.

Referring to FIG. 11, a cross section view cutting through the bridging layer 6012 and the contact via 961 of FIG. 10 is shown. Two control lines 6010(k−1) and 6010(k) are connected together by the bridge 6012. A contact via 961 connects the bridge 6012 to a main control line 6011(k). The bit line 4020(j+1) connects to a second connection region 412 through contact via 942. The bit line 4020(j+1) appears to stop in the middle of FIG. 11, but this is because of the jog of bit line 4020(j+1) shown in FIG. 10. An isolation area 202 runs in the first direction below bridge and a portion of the bit line 4020(j+1). The control lines 6010(k−1), 6010(k), and 6021(k) and the word line 6030(k) extend in the second direction over the isolation area 202. An inter-insulating layer 800 is used to isolate the various conducting layers and insulators 701 and 702 are used to isolate control lines 6010 and 6020 from the word line 6030.

To write a high threshold, Vthh, or a low threshold, Vthl, in the trap sites in the first insulator 501 under the first conductive gate 601 of the unit cell 4100, which is designated as Cj,k, the combinations shown in Table 1 are used.

TABLE 1

| Cj−1, k | Cj, k | Cj+1, k | Cj+2, k | Cj+3, k | 4010 (j−1) | 4020 (j) | 4010 (j) | 4020 (j+1) | 4010 (j+1) | 4020 (j+2) |
|---|---|---|---|---|---|---|---|---|---|---|
| * | l | l | * | * | L (B) | B (L) | H (L) | B (L) | L (B) | L or B* |
| * | l | h | * | * | L (B) | B | H | L | L (B) | L or B* |
| * | h | l | * | * | L (B) | L | H | B | L (B) | L or B* |
| * | h | h | * | * | L (B) | L | H | L | L (B) | L or B* |
| h or l | * | * | l | l | L or B | L or B* | L (B) | B (L) | H (L) | B (L) |
| h or l | * | * | l | h | L or B | L or B* | L (B) | B | H | L |
| h or l | * | * | h | l | L or B | L or B* | L (B) | L | H | B |
| h or l | * | * | h | h | L or B | L or B* | L (B) | L | H | L |

In the table 1 and 2, the following notations are used for the simplicity. A mark "*" denotes "un-written". A "1" denotes a low threshold state Vthl (e.g. 0.3V~0.7V, usually as was "erased") and an "h" denotes a high threshold state Vthh (e.g. 1.5V~2V, electrons injected to the trap site 501). The threshold voltages are those measured at the first or second conductive gate. H denotes a voltage necessary to accelerate and to inject electrons into the trap sites 501 or 502. L denotes a write-select voltage, usually 0V for 2 level storage. A voltage difference (H−L) (e.g. 3~6V) must be larger than a barrier height (in an unit of electron volt, 2.5~3.2 eV for SiOxNy—Si interface) against electrons between the first or second channel forming region and the first or second insulator. B denotes a write-inhibit voltage, where a voltage difference (H−B) (e.g. 2~2.5V) is less than the barrier height. L(B) or B(L) which means that either voltage L or B can be applied to the designated bit line. However, application of bias B to the designated bit lines improves write disturb. Similarly, H(L) means that either H or L can be applied to the designated bit line. For the write, word line 6030(k) is biased above a threshold voltage of the third conductive gate Vth3 to control a write current to a predetermined value (e.g. a few micro-ampere~a few tens of micro-ampere). In the table 1, the control line 6010(k) is biased to a carrier collecting voltage Vctlcol (>the barrier height) the control line 6021(k) is biased to an override voltage Vctlrr (>Vthh) to override a highest "written threshold voltage".

In the Table 2, the bias to 6010(k) and the bias to 6021(k) is interchanged. To write Vthh or Vthl in the trap site in insulator 502, under the second conductive gate of the unit cell Cjk with the following combination, each bit line is biased as shown in Table 2.

TABLE 2

| Cj − 1, k | Cj, k | Cj + 1, k | Cj + 2, k | Cj + 3, k | 4010 (j − 1) | 4020 (j) | 4010 (j) | 4020 (j + 1) | 4010 (j + 1) | 4020 (j + 2) |
|---|---|---|---|---|---|---|---|---|---|---|
| l | l | * | * | h or l | B (L) | H (L) | B (L) | L (B) | L or B* | L or B |
| l | h | * | * | h or l | B | H | LC | L (B) | L or B* | L or B |
| h | l | * | * | h or l | L | H | B | L (B) | L or B* | L or B |
| h | h | * | * | h or l | L | H | L | L (B) | L or B* | L or B |
| * | * | l | l | * | L or B* | L (B) | B (L) | H (L) | B (L) | L (B) |
| * | * | l | h | * | L or B* | L (B) | B | H | L | L (B) |
| * | * | h | l | * | L or B* | L (B) | L | H | B | L (B) |
| * | * | h | h | * | L or B* | L (B) | L | H | L | L (B) |

In the above mentioned write mode, control lines 6010 and 6020 of unselected cells of a same block are preferred to be biased to a voltage between B and L.

To read Vthh or Vthl in storage site 501 of the unit cell Cjk with following combination, each bit line is biased as shown in Table 3.

TABLE 3

| Cj − 1, k | Cj, k | Cj + 1, k | Cj + 2, k | Cj + 3, k | 4010 (j − 1) | 4020 (j) | 4010 (j) | 4020 (j + 1) | 4010 (j + 1) | 4020 (j + 2) |
|---|---|---|---|---|---|---|---|---|---|---|
| * | r | r | * | * | RB | RH | RL | RH | RB | RH |
| R | * | * | r | r | RL | RH | RB | RH | RL | RH |

In the table 3 and 4 the following notations are used for the simplicity: "r" indicates a selected cell for read, "*" indicates an unselected cell, RH indicates read bit voltage (e.g. 1.8~2.2V) to detect Vthl or Vthh by a current through the biased bit line, RL indicates read-select voltage (e.g. 0V), RB indicates read-inhibit voltage (>(Vctls−Vthl), e.g. 1.2V). Where, Vctls denotes a sense voltage applied to a selected control line 6010k (in Table 1) or 6020k (in Table 2). The other control line, 6020(k) or 6010(k), is biased to a override voltage Vctlrr (e.g. Vthh+1V) to override the highest "written Vth". A selected word line is biased to Vth3+1~2V. Unselected word lines are biased to a voltage lower than Vth3.

To read Vthh or Vthl in trapping sites within insulator 502 of the unit cell Cjk, each bit line is biased as shown in Table 4.

TABLE 4

| Cj − 1, k | Cj, k | Cj + 1, k | Cj + 2, k | Cj + 3, k | 4010 (j − 1) | 4020 (j) | 4010 (j) | 4020 (j + 1) | 4010 (j + 1) | 4020 (j + 2) |
|---|---|---|---|---|---|---|---|---|---|---|
| r | r | * | * | r | RH | RL | RH | RB | RH | RL |
| * | * | r | r | * | RH | RB | RH | RL | RH | RB |

In the present invention this write algorithm or read algorithm is called as "split write" or "split read". The split write employs three bit lines (e.g. 4020(j), 4010(j), 4020(j+1)) for writing a pair of hard bits sandwiched between each two bit lines. A center bit line 4010(j) is biased to a voltage H for the acceleration-injection of electrons and bit lines 4020(j) and 4020(j+1) on the outside of the selected three bit lines are biased to a write-inhibit voltage B or a write-selection voltage L. The write-selection voltage L can be 0V for 2 level storage and can be selected out of multilevel voltages (e.g. 0, 0.5, 1, 1.5V for 4 level storage) for setting a storage level in multilevel storage. Each one bit-line 4010(j−1) and 4010(j+1) adjacent to the selected triplet is idled (biased to 0V or the write-inhibit voltage B). Thus every other two hard bits are written. To write the rest of the two hard bit set, the other set of three bit lines (e.g. 4020(j+1), 4010(j+1), 4020(j+2)) are selected.

A split read also employs three bit lines for sensing a pair of hard bits sandwiched by two out of the selected three bit lines (e.g. 4020(j), 4010(j), 4020(j+1)). A center bit line 4010(j) is biased to a read selection voltage RL. RL can be 0V for 2 level storage and can be selected out of multilevel voltages for multilevel sensing. Bit lines of both sides 4020(j) and 4020(j+1) out of the selected three bit lines are used for sensing by applying a read voltage RH. The sensing can be done by either detecting current value through the bit lines or discharge time after pre-charging the bit lines. Each bit-line 4010(j−1) and 4010(j+1) adjacent to the selected triplet is idled (biased to a read-inhibit voltage RB). Thus every other two hard bits are sensed. To read the rest of two hard bit set, the other set of three bit lines (e.g. 4020(j+1), 4010(j+1), 4020(j+2)) are selected.

In the write or read algorithm described above, every other pair hard bits are selected to make one group for the write or read at the same time. Thus to write or read all bits on one control line, at least a twice write or read is necessary. However, a recent large capacity nonvolatile memory array has a hardware organization equal to or more than two Kbit/word-line, and considering that the present memory cell has two hard bits/cell, the present array architecture allows writing five hundred and twelve bits/word-line at the same time. This number is large enough for fast write and is equivalently as fast as the order of several hundreds of Mbit/sec, when write time per cell is around 1 microsecond. Hard bit location skipping, every two hard bits in the write and read, can be masked from outside of a chip by a virtual address technology.

Erase of the stored information in trap sites can be performed by hot hole injection to annihilate stored electron charge or to recombine the stored electrons with the injected holes, or performed by tunneling-back of stored electrons in the trap sites by Fowler-Nordheim tunneling and/or direct tunneling. For the hot hole erasure, bit lines are biased to a positive voltage EH (e.g. 4~7V) and control lines are biased to zero or a negative voltage ENh (0~–5V). For the tunnel-back erasure, the control lines are negatively biased (e.g. –8~–12V) with respect to the channel-forming region. This is realized by biasing the control lines to ENt (–8~–12V), or biasing the semiconductor surface region 200 (usually a p-type well) to EHt (3~6V) and biasing the control lines to ENt+EHt.

In the present array architecture, opposite conductivity type regions of unselected cells connected to a selected bit lines are also biased to H or EH in the write operation. This will cause over a long time span some change in the number of stored electrons in the trap sites of the unselected cells. To avoid this write disturb or erase disturb, dividing chip level array size into a number of blocks and connecting the bit line in the each block to a main bit line through a select transistor is preferable. A bit size of the block can be the size of a block erase mode.

The present array architecture can be realized by a fabrication process more compatible to an MOS logic LSI fabrication process as compared with previously proposed array architecture. Higher write and/or read speed is possible because of a lower bit line resistance. Still high hard bit density near to $4F^2$ is possible when a self-align contact technology and a border less contact STI technology (STI: shallow trench isolation) can be used. These two technologies are common to recent advanced MOS logic LSI technologies.

While the invention has been particularly shown and described with reference to preferred embodiments thereof, it will be understood by those skilled in the art that various changes in form and details may be made without departing from the spirit and scope of the invention.

What is claimed is:

1. A nonvolatile memory array, comprising:
   a plurality of memory cells two dimensionally disposed in a first direction and in a second direction,
   a plurality of first connection regions,
   a plurality of second connection regions,
   a plurality of conductive bit lines extending in said first direction,
   a plurality of conductive word lines extending in said second direction,
   a plurality of conductive control lines extending in said second direction,
   each of said plurality of first connection regions connecting together in said second direction a first cluster of cells where said first cluster further comprises a first cell and a second cell that are adjacent in said first direction with a third cell and a fourth cell that are adjacent in said second direction to said first and second cells,
   each of said plurality of second connection regions connecting together in said second direction a second cluster of cells where said second cluster further comprises a cell of said first cluster of cells, a fifth cell adjacent in said first direction to said cell of said first cluster of cells, and a sixth cell and a seventh cell that are adjacent in said second direction to said cell of said first cluster of cells and said fifth cell,
   a first portion of said plurality of bit lines connecting together said plurality of first connection regions in said first direction,
   a second portion of said plurality of bit lines connecting together said plurality of second connection regions in said first direction.

2. The memory array of claim 1, wherein said plurality of first and second connection regions further comprise:
   each of said plurality of first connection regions electrically connecting a first semiconductor region of a first memory cell to a first semiconductor region of a first neighboring memory cell in said second direction, wherein said first semiconductor regions of said first memory cell and said first neighboring memory cell are of opposite conductivity type to that of a surface semiconductor region,
   each of said plurality of second connection regions electrically connecting a second semiconductor region of said first memory cell to a second semiconductor region of a second neighboring memory cell in said second direction, wherein said second semiconductor regions of said first memory cell and said second neighboring memory cell are of opposite conductivity type to that of said surface semiconductor region,
   said plurality of first connection regions being connected on a first high conductive layer which is insulated from and crossing over first, second and third conducting gates,
   said plurality of second connection regions being connected on a second high conductive layer which is insulated from and crossing over said first, second and third conducting gates,
   said bit lines comprising said first and second high conductive layer.

3. The memory array of claim 1, wherein said first and second connection regions are of opposite semiconductor conductivity type to that of a surface semiconductor region of said memory cells.

4. The memory array of claim 1, wherein said first and second connection regions are formed continuously in opposite conductivity type to that of a surface semiconductor region of said memory cells to be connected to one out of said first or second semiconductor regions of the memory cells.

5. The memory array of claim 1, wherein a third high conductive layer contacts said word line.

6. The memory array of claim 1, wherein said memory cell further comprises:
   a channel forming semiconductor region in a semiconductor surface region of a substrate,
   said substrate being a semiconductor substrate or having a semiconductor surface region on a insulating substrate,
   a first semiconductor region and a second semiconductor region of a conductivity type that is opposite to that of said semiconductor surface region being disposed in said surface region of said substrate and said first and second semiconductor regions being spaced apart and separated from each other by said channel forming semiconductor region,
   said channel forming semiconductor region further comprising:
      a first channel forming region laterally contacting said first semiconductor region,
      a second channel forming region contacting said second semiconductor region, a third channel forming region in contact with said first and second channel forming regions and disposed between said first channel forming region and said second channel forming region, a first gate insulator disposed on said first channel forming region and on a portion of said first conductivity region adjacent to said first channel forming region, a second gate insulator disposed on said second channel forming region and on a portion of said second semiconductor region adjacent to said second channel forming region, a third gate insulator disposed on said third channel forming region.

7. The memory array of claim 6, wherein said first semiconductor region is connected to a first high conductive layer which is insulated from and crossing over first, second and third conductive gates, and said second semiconductor region is connected to a second high conductive layer which is insulated from and crossing over said first, second and third conducting gates.

8. The memory array of claim 6, wherein said first and second connection regions comprise:

a first doped poly-silicon layer contacting said first semiconductor region of a first memory cell of said plurality of memory cells and said first semiconductor region of a neighboring cell in a second direction, a second doped poly-silicon layer contacting said second semiconductor region of said first memory cell and a second semiconductor region of an another neighboring cell in the second direction.

9. The memory array of claim 6, wherein said memory cell further comprises:

a first conductive gate on said first gate insulator, a second conductive gate on said second gate insulator, a third conductive gate on said third gate insulator, said first, second and third conductive gates being electrically insulated from each other and a portion of said first conductive gate overlapping a portion of said first semiconductor region on said first insulator, a portion of said second conductive gate overlapping a portion of said second semiconductor region on said second insulator, said first and second insulator providing carrier trapping sites for carrier storage.

10. The memory array of claim 9 wherein said third gate of each cell is disposed side-by-side in said second direction, is continuous or connected together in said second direction and forms a part of one word line out of said plurality of word lines.

11. The memory array of claim 9 wherein said first gate of each cell disposed side-by-side in the second direction, is continuous or connected together in said second direction and forms a part of a first control line out of said plurality of control lines.

12. The memory array of claim 9 wherein said second gate of each cell disposed side-by-side in the second direction, is continuous or connected together in said second direction, and forms a part of a second control line out of said plurality of control lines.

13. The memory array of claim 9, wherein said third conductive gate of a first cell of said plurality of memory cells and said first conductive gate of an adjacent cell is disposed in the first direction and being connected by a bridging region; said bridging region being connected to a first high conductive layer extending in said second direction and insulated from said first and second semiconductor regions, said connection regions and said third conductive gates.

14. The memory array of claim 9, wherein said second conductive gate of a first cell of said plurality of memory cells and said second conductive gate of an adjacent cell is disposed in the first direction and being connected by a bridging region; said bridging region being connected to a fourth high conductive layer extending in said a second direction and insulated from said first and second semiconductor regions, said connection regions and said third conductive gates.

15. The memory array of claim 9, wherein said first conductive gate of each memory cell is disposed side-by-side in said second direction, being continuous in said second direction and forming a part of a first control line of said plurality of control lines, the continuous part of said first control gate being disposed on a fourth insulator on or in the surface of said substrate with thickness greater than said first insulator, said second gate of each cell disposed side-by-side in the second direction, being continuous in the first direction and forming a part of a second control line of said plurality control lines, said continuous part of said second control gate being disposed on a fourth insulator on or in the surface of said substrate.

16. A writing method of a nonvolatile memory array, wherein said nonvolatile memory array comprises a plurality of memory cells two dimensionally disposed in a first direction and in a second direction, a plurality of connection regions, a plurality of conductive bit lines extending is said first direction, a plurality of conductive word lines extending in said second direction, a plurality of conductive control lines extending in said second direction, and wherein said connection regions connect cells with cells in said second direction, the writing method comprising:

selecting a set of three bit lines for writing a pair of hard bits in two memory cells sandwiched between two bit lines from said set of three bit lines, biasing a center bit line out of said set of three bit lines to a first voltage for the acceleration injection of electrons, biasing both bit lines to either side of said center bit line to a write inhibit voltage or a write select voltage, biasing bit-lines adjacent to said set of three bit lines to a second voltage ranging from a low voltage to the write inhibit voltage, selecting a word line and biasing said word line to a third voltage to control a write current to a predetermined value, biasing a first control line to a fourth voltage to allow carrier collecting where said control line is adjacent to said word line and adjacent to a semiconductor region of one of said cells which is connected to said center bit line, biasing a second control line adjacent to said word line to a fifth voltage to override a highest written threshold voltage.

17. A reading method of a nonvolatile memory array wherein said nonvolatile memory array comprises a plurality of memory cells two dimensionally disposed in a first direction and in a second direction, a plurality of connection regions, a plurality of conductive bit lines extending is said first direction, a plurality of conductive word lines extending in said second direction, a plurality of conductive control lines extending in said second direction, and wherein said connection regions connect cells with cells in said second direction, the reading method, comprising:

selecting a set of three bit lines for reading a pair of hard bits in two memory cells sandwiched between two bit lines out of the set of three bit lines, biasing a center bit line of said set of three bit lines to a read select voltage, biasing both bit lines to either side of said center bit line to a read bit voltage, biasing bit-lines adjacent to said set of three bit lines to a read-inhibit voltage, selecting a word line and biasing said word line to a voltage larger than threshold voltage of a third gate, biasing a first control line to a sensing voltage where said first control line is adjacent to said word line and adjacent to a semiconductor region of one of said cells which is connected to said center bit line, biasing a second control line adjacent to said word line to a voltage to override a written threshold voltage, sensing read current through said two bit lines located on either side of said center bit line.

\* \* \* \* \*

UNITED STATES PATENT AND TRADEMARK OFFICE
CERTIFICATE OF CORRECTION

PATENT NO. : 6,469,935 B2
DATED : October 22, 2002
INVENTOR(S) : Yutaka Hayashi

It is certified that error appears in the above-identified patent and that said Letters Patent is hereby corrected as shown below:

Title page,
Item [54], should read -- ARRAY ARCHITECTURE OF NONVOLATILE MEMORY AND ITS OPERATION METHODS --.

Signed and Sealed this

Eighteenth Day of March, 2003

JAMES E. ROGAN
*Director of the United States Patent and Trademark Office*